(12) United States Patent
Jeng et al.

(10) Patent No.: US 10,290,605 B2
(45) Date of Patent: May 14, 2019

(54) FAN-OUT PACKAGE STRUCTURE AND METHOD FOR FORMING THE SAME

(71) Applicant: Taiwan Semiconductor Manufacturing Co., Ltd., Hsinchu (TW)

(72) Inventors: Shin-Puu Jeng, Po-Shan Village (TW); Hsien-Wen Liu, Hsinchu (TW); Po-Yao Chuang, Hsinchu (TW); Tzu-Jui Fang, Hsinchu (TW); Yi-Jou Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/800,548

(22) Filed: Nov. 1, 2017

(65) Prior Publication Data
US 2019/0006314 A1    Jan. 3, 2019

Related U.S. Application Data

(60) Provisional application No. 62/527,168, filed on Jun. 30, 2017.

(51) Int. Cl.
*H01L 23/12* (2006.01)
*H01L 21/00* (2006.01)
(Continued)

(52) U.S. Cl.
CPC ............ *H01L 24/96* (2013.01); *H01L 21/486* (2013.01); *H01L 21/4853* (2013.01); *H01L 21/4857* (2013.01); *H01L 21/561* (2013.01);
*H01L 21/565* (2013.01); *H01L 21/78* (2013.01); *H01L 23/3114* (2013.01); *H01L 23/5383* (2013.01); *H01L 23/5384* (2013.01);
(Continued)

(58) Field of Classification Search
CPC . H01L 24/96; H01L 21/4853; H01L 21/4857; H01L 21/561; H01L 21/565; H01L 21/78; H01L 23/3114; H01L 23/5383; H01L 23/5386; H01L 23/5389; H01L 24/19; H01L 24/20
See application file for complete search history.

(56) References Cited

U.S. PATENT DOCUMENTS 9,000,584 B2   4/2015 Lin et al.
9,048,222 B2   6/2015 Hung et al.
(Continued)

*Primary Examiner* — Alonzo Chambliss
(74) *Attorney, Agent, or Firm* — McClure, Qualey & Rodack, LLP

(57) ABSTRACT

Package structures and methods for forming the same are provided. A package structure includes a semiconductor die. The semiconductor die includes a passivation layer over a semiconductor substrate. The semiconductor die also includes a conductive pad in the passivation layer. The passivation layer partially exposes a top surface of the conductive pad. The package structure also includes an encapsulation layer surrounding the semiconductor die. The package structure further includes a dielectric layer covering the semiconductor die and the encapsulation layer. In addition, the package structure includes a redistribution layer covering the dielectric layer. The redistribution layer extends in the dielectric layer to be physically connected to the top surface of the conductive pad.

16 Claims, 17 Drawing Sheets

(51) Int. Cl.
- *H01L 23/00* (2006.01)
- *H01L 23/538* (2006.01)
- *H01L 23/31* (2006.01)
- *H01L 21/48* (2006.01)
- *H01L 21/56* (2006.01)
- *H01L 21/78* (2006.01)

(52) U.S. Cl.
CPC ...... *H01L 23/5386* (2013.01); *H01L 23/5389* (2013.01); *H01L 24/19* (2013.01); *H01L 24/20* (2013.01); *H01L 2224/214* (2013.01); *H01L 2224/95001* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,837,359 B1* | 12/2017 | Chiu ................... H01L 23/5389 |
| 2013/0200528 A1* | 8/2013 | Lin ................... H01L 21/76877 257/774 |
| 2015/0228552 A1* | 8/2015 | Lin ................... H01L 21/568 257/773 |
| 2015/0262909 A1* | 9/2015 | Chen ................ H01L 21/76804 257/774 |
| 2016/0071818 A1* | 3/2016 | Wang ................ H01L 25/0655 257/774 |
| 2018/0190581 A1* | 7/2018 | Lin ........................ H01L 24/97 |

* cited by examiner

FAN-OUT PACKAGE STRUCTURE AND METHOD FOR FORMING THE SAME

CROSS REFERENCE TO RELATED APPLICATIONS

This Application claims the benefit of U.S. Provisional Application No. 62/527,168, filed on Jun. 30, 2017, the entirety of which is incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

A chip package not only provides protection for semiconductor devices from environmental contaminants, but also provides a connection interface for the semiconductor devices packaged therein. Packaging technologies can be divided into multiple categories. In one of the categories of packaging, dies are sawed from wafers before they are packaged onto other wafers, and "known-good-dies" are packaged. An advantage of this packaging technology is the possibility of forming fan-out chip packages, which means that I/O pads on a die can be redistributed to a greater area than the die itself. Therefore, the number of I/O pads packed on the surfaces of the dies can be increased.

New packaging technologies have been developed to further improve the density and functions of semiconductor dies. These relatively new types of packaging technologies for semiconductor dies face manufacturing challenges, and they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
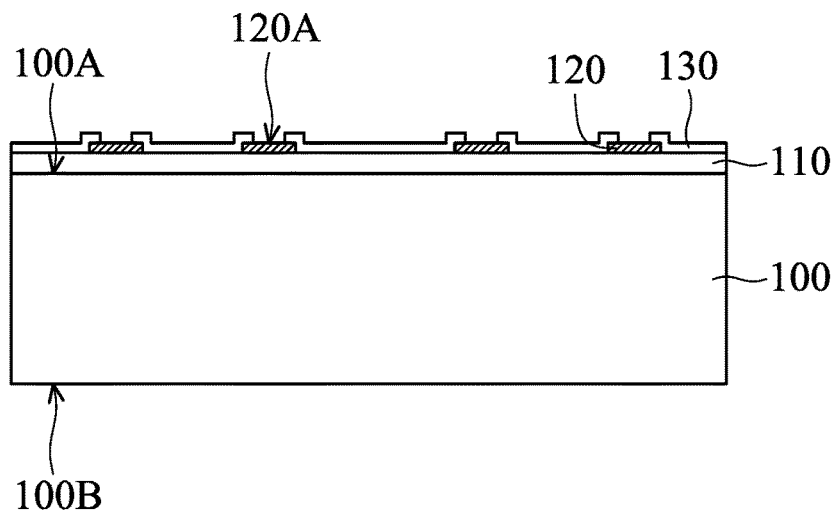
FIGS. 1A-1L are cross-sectional views of various stages of a process for forming a package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1L are cross-sectional views of various stages of a process for forming a package structure, in accordance with some embodiments. The package structure may be applied to wafer level package (WLP).

As shown in FIG. 1A, a semiconductor substrate 100 is provided, in accordance with some embodiments. The semiconductor substrate 100 may be a wafer substrate. For a better understanding of the structure, the semiconductor substrate 100 is partially shown in figures. In some embodiments, the semiconductor substrate 100 includes silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

Various active elements (not shown) are formed in and/or over the semiconductor substrate 100, in accordance with some embodiments. Examples of the various active elements include transistors, diodes, another suitable element, or a combination thereof. The transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc. Various passive elements (not shown) may also be formed in and/or over the semiconductor substrate 100. Examples of the various passive elements include capacitors, inductors, resistors, another suitable passive element, or a combination thereof.

Active and/or passive elements may be formed in and/or over the semiconductor substrate 100 using front-end semiconductor fabrication processes, which may be referred to as front end of line (FEOL) processes. Subsequently, an interconnection structure may be formed over the semiconductor substrate 100 using back-end semiconductor fabrication processes, which may be referred to as back end of line (BEOL) processes.

For example, a dielectric layer 110 is formed over the surface 100A of the semiconductor substrate 100, as shown in FIG. 1A in accordance with some embodiments. The dielectric layer 110 covers active and/or passive elements over the semiconductor substrate 100. The dielectric layer 110 may be a multi-layer structure (not shown), which includes an interlayer dielectric (ILD) layer and one or more inter-metal dielectric (IMD) layers. Multiple conductive features (not shown) are formed in the ILD layer and IMD layers and electrically connected to active or passive elements in and/or over the semiconductor substrate 100. Examples of the conductive features include conductive contacts, conductive lines and/or conductive vias.

In some embodiments, the dielectric layer 110 includes or is made of silicon oxide, silicon oxynitride, borosilicate glass (BSG), phosphoric silicate glass (PSG), borophosphosilicate glass (BPSG), fluorinated silicate glass (FSG), low-K material, porous dielectric material, another suitable dielectric material, or a combination thereof. The material of the dielectric layer 110 is selected to minimize size, propagation delays, and crosstalk between nearby conductive features.

As shown in FIG. 1A, conductive pads 120 are formed over the dielectric layer 110, in accordance with some embodiments. The conductive pads 120 are electrically connected to active or passive elements in and/or over the semiconductor substrate 100 through the conductive features in the dielectric layer 110. The conductive pads 120 may be wider portions of some conductive lines formed on the dielectric layer 110 or embedded in the dielectric layer 110. Therefore, the active or passive elements may be electrically connected to other elements through the conductive pads 120. In some embodiments, the conductive pads 120 include aluminum (Al), copper (Cu), silver (Ag), gold (Au), nickel (Ni), tungsten (W), another suitable material, or a combination thereof.

As shown in FIG. 1A, a passivation layer 130 is formed over the dielectric layer 110, in accordance with some embodiments. The passivation layer 130 partially covers the conductive pads 120 so that the conductive pads 120 are embedded in the passivation layer 130. The conductive pads 120 have a top surface 120A partially exposed through openings of the passivation layer 130.

Although FIG. 1A shows that the passivation layer 130 is a single layer, embodiments of the disclosure are not limited thereto. In some other embodiments, the passivation layer 130 is a multi-layer structure including sub-layers (not shown). In some embodiments, the passivation layer 130 includes or is made of silicon nitride, silicon oxide, silicon oxynitride, polyimide (PI), polybenzoxazole (PBO), benzocyclobutene (BCB), another suitable dielectric material, or a combination thereof.

Figure 1B:
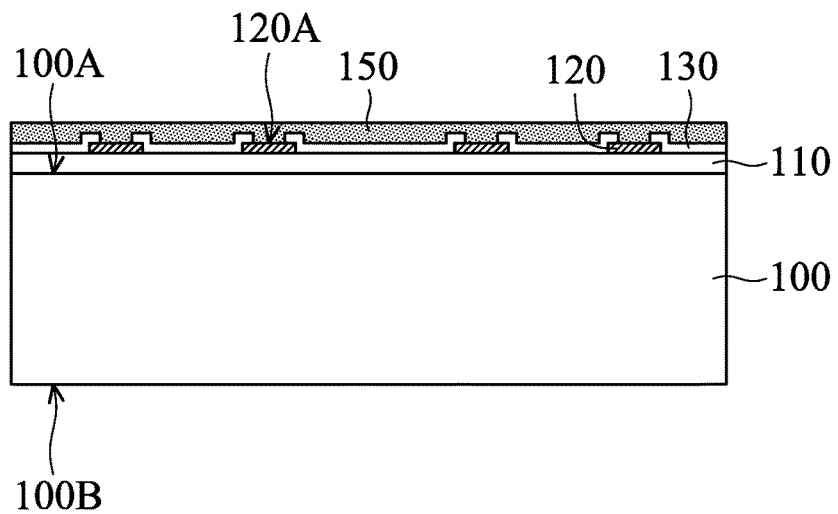

As shown in FIG. 1B, a protection layer 150 is deposited over the passivation layer 130, in accordance with some embodiments. The protection layer 150 fills up the openings of the passivation layer 130. As a result, the protection layer 150 adjoins the passivation layer 130 and the conductive pads 120. In some embodiments, the protection layer 150 is in direct contact with the top surface 120A of the conductive pads 120. The protection layer 150 may be referred to as a sacrificial layer, which will be removed in a subsequent process. The protection layer 150 can provide the conductive pads 120 with sufficient protection during subsequent processes.

In some embodiments, the protection layer 150 includes or is made of PI, PBO, BCB, resin, epoxy, a photoresist material, another suitable organic material, or a combination thereof. In some embodiments, the protection layer 150 and the passivation layer 130 include or are made of different materials. For example, the protection layer 150 is an organic material layer while the passivation layer 130 is a non-organic material layer (such as a silicon nitride layer). However, embodiments of the disclosure are not limited thereto. The protection layer 150 and the passivation layer 130 may include the same material. In some embodiments, the protection layer 150 is deposited using a spray coating process, a spin-on process, a chemical vapor deposition (CVD) process, an atomic layer deposition (ALD) process, a physical vapor deposition (PVD) process, another applicable process, or a combination thereof.

Afterwards, a thinning process is performed over the surface 100B of the semiconductor substrate 100 to thin down the semiconductor substrate 100, in accordance with some embodiments. The thinning process may include a grinding process, a chemical mechanical polishing (CMP) process, another applicable process, or a combination thereof.

Figure 1C:
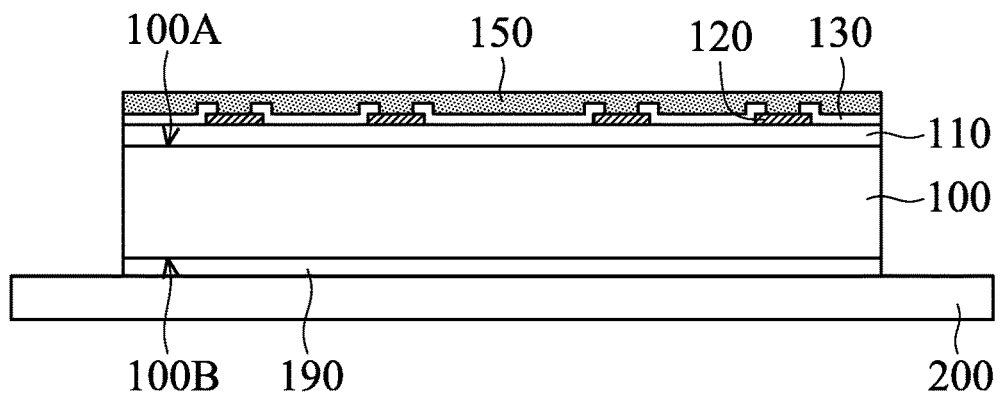

Subsequently, the thinned semiconductor substrate 100 is attached or bonded to a substrate 200 through an adhesive layer 190, as shown in FIG. 1C in accordance with some embodiments. As a result, the surface 100B of the semiconductor substrate 100 faces the adhesive layer 190 and the substrate 200. The adhesive layer 190 is sandwiched between the surface 100B and the substrate 200. In some embodiments, the substrate 200 is a dicing frame or another suitable substrate. In some embodiments, the adhesive layer 190 includes a die attach film (DAF), another suitable adhesive material, or a combination thereof.

Figure 1D:
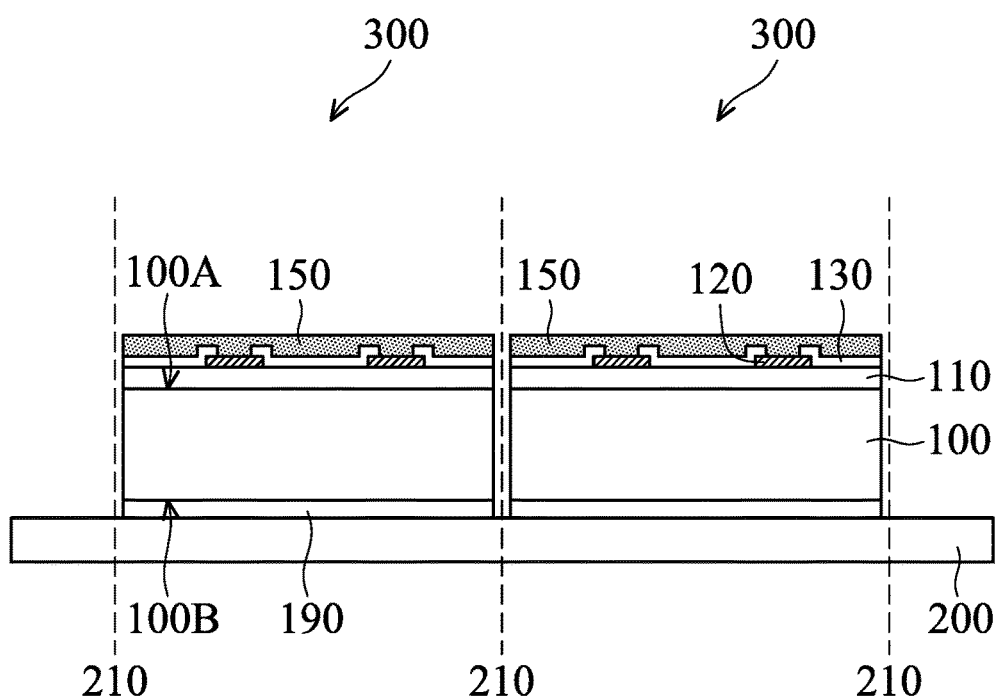

Afterwards, a singulation process is performed over the substrate 200 to form multiple semiconductor dies 300, as shown in FIG. 1D in accordance with some embodiments. In some embodiments, the singulation process includes a dicing process or another applicable process. For example, the protection layer 150, the passivation layer 130, the dielectric layer 110 and the semiconductor substrate 100 are sawed or cut along the scribe lines 210 using a blade or laser. As a result, separated semiconductor dies 300 are formed and then picked up from the substrate 200.

In some embodiments, the semiconductor dies 300 are logic dies, central processing unit (CPU) dies, memory dies (e.g., static random access memory, SRAM dies), sensor dies, or other suitable dies. Each of the semiconductor dies 300 includes the semiconductor substrate 100, the dielectric layer 110, the conductive pads 120, the passivation layer 130, the protection layer 150 and the adhesive layer 190, in accordance with some embodiments. In some embodiments, each of the semiconductor dies 300 does not include conductive connectors (e.g., conductive bumps or pillars) covering the conductive pads 120.

Figure 1E:
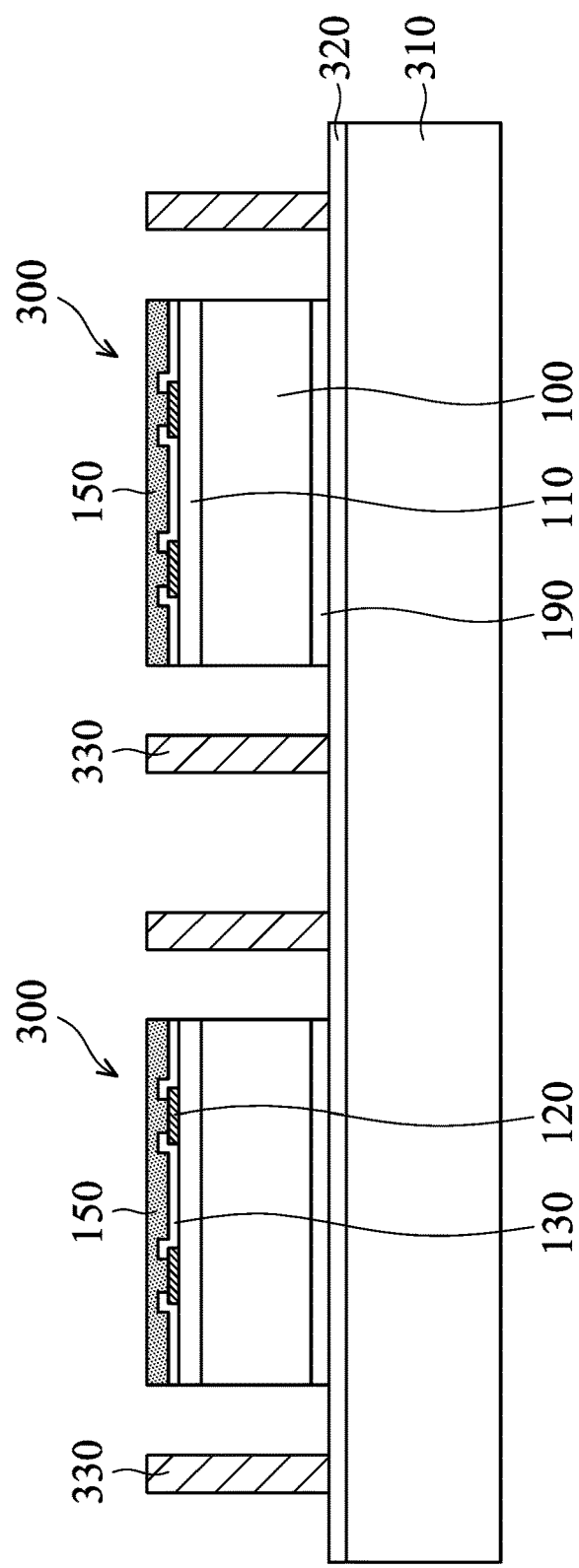

As shown in FIG. 1E, a carrier substrate 310 is provided, in accordance with some embodiments. In some embodiments, the carrier substrate 310 is used as a temporary substrate. The temporary substrate provides mechanical and structural support during subsequent processing steps, such as those described in more detail later. In some embodiments, the carrier substrate 310 is made of a glass material, semiconductor material, ceramic material, polymer material, metal material, another suitable material, or a combination thereof. In some embodiments, the carrier substrate 310 is a wafer substrate.

As shown in FIG. 1E, an adhesive layer 320 is deposited over the carrier substrate 310, in accordance with some embodiments. In some embodiments, the adhesive layer 320 is used as a temporary adhesive layer. The adhesive layer 320 may be made of glue, or may be a lamination material, such as a foil. In some embodiments, the adhesive layer 320 is photosensitive and is easily detached from the carrier substrate 310 by light irradiation. For example, shining ultra-violet (UV) light or laser light on the carrier substrate 310 is used to detach the adhesive layer 320. In some embodiments, the adhesive layer 320 is a light-to-heat-conversion (LTHC) coating. In some other embodiments, the adhesive layer 320 is heat-sensitive and is easily detached from the carrier substrate 310 when it is exposed to heat.

Many variations and/or modifications can be made to embodiments of the disclosure. In some other embodiments, a base layer (not shown) is deposited or laminated over the adhesive layer 320. The base layer may be a polymer layer or a polymer-containing layer. For example, the base layer may be a PBO layer, a PI layer, a solder resist (SR) layer, an Ajinomoto buildup film (ABF), a die attach film (DAF), another suitable layer, or a combination thereof.

As shown in FIG. 1E, multiple conductive features 330 are formed over the adhesive layer 320, in accordance with some embodiments. Alternatively, the conductive features 330 may be formed over the base layer (not shown) covering the adhesive layer 320. In some embodiments, the conductive features 330 are conductive pillars or other suitable features. The conductive features 330 may be referred to as through integrated fan-out vias (TIVs) or through package vias (TPVs).

In some embodiments, each of the conductive structures 330 has a vertical sidewall. In some embodiments, the conductive structures 330 are substantially as high as each other. However, embodiments of the disclosure are not limited thereto. One or more of these conductive structures 330 may have a different height than that of other conductive structures 330. In some embodiments, each of the conductive structures 330 is substantially circular from a top view.

In some embodiments, the conductive features 330 are made of a metal material. The metal material may include Cu, Ti, Au, Co, Al, W, another suitable material, or a combination thereof. In some embodiments, the conductive features 330 are made of a solder material that includes Sn. In some other embodiments, the conductive features 330 are made of a metal material that does not include Sn.

In some embodiments, the conductive features 330 are formed using a plating process. The plating process may include an electroplating process, an electroless plating process, another applicable process, or a combination thereof. However, many variations and/or modifications can be made to embodiments of the disclosure. In some other embodiments, the conductive features 330 are formed using a CVD process, a PVD process, a spin-on process, an electrochemical deposition (ECD) process, a molecular beam epitaxy (MBE) process, an ALD process, another applicable process, or a combination thereof.

For example, a mask layer (not shown) is formed over the adhesive layer 320. The mask layer has openings that define the positions where the conductive features 330 will be formed. In some embodiments, the mask layer is made of a photoresist material. The openings of the mask layer may be formed by a photolithography process, which includes exposure and development operations. A conductive material is deposited to completely or partially fill the openings in the mask layer. The conductive material and the mask layer may be planarized and thinned using a grinding process, a CMP process, an etching process, another applicable process, or a combination thereof. Afterwards, the mask layer is removed, and the deposited conductive material forms the conductive features 330.

Although FIG. 1E shows that multiple conductive features 330 are formed over the adhesive layer 320, embodiments of the disclosure are not limited thereto. In some other embodiments, the conductive features 330 are not formed.

Subsequently, the semiconductor dies 300 with the protection layer 150 are mounted to the carrier substrate 310, as shown in FIG. 1E in accordance with some embodiments. The adhesive layer 190 of the semiconductor dies 300 is attached to the adhesive layer 320 so that the surface 100B of the semiconductor substrate 100 faces the adhesive layer 320 and the carrier substrate 310. One of the semiconductor dies 300 is positioned between two of the conductive features 330, as shown in FIG. 1E. The semiconductor dies 300 may be discontinuously surrounded by multiple conductive features 330 from a top view.

Although FIG. 1E shows two semiconductor dies 300 bonded to the carrier substrate 310, embodiments of the disclosure are not limited thereto. In some other embodiments, fewer or more semiconductor dies 300 are bonded to the carrier substrate 310.

Figure 1F:
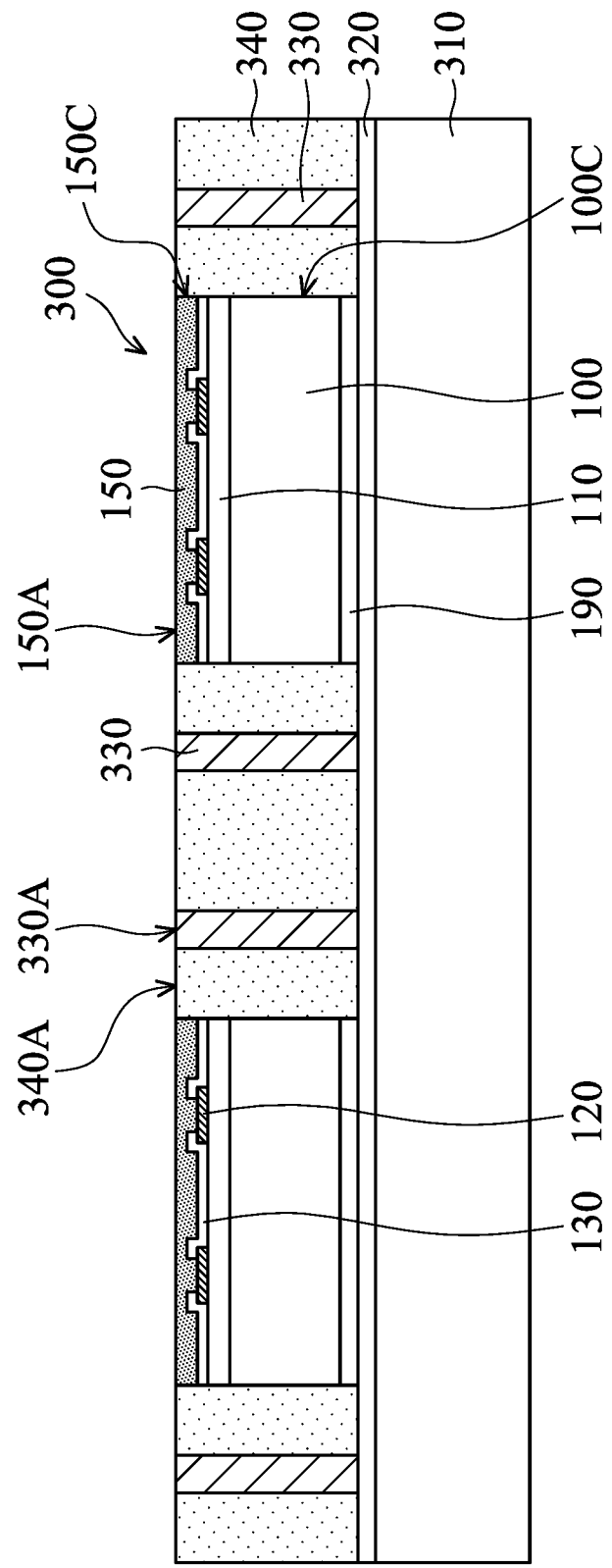

As shown in FIG. 1F, an encapsulation layer (or a package layer) 340 is deposited over the adhesive layer 320, in accordance with some embodiments. As a result, the conductive features 330 and the semiconductor dies 300 are embedded in the encapsulation layer 340. In some embodiments, the encapsulation layer 340 adjoins the sidewall 150C of the protection layer 150 and the sidewall 100C of the semiconductor substrate 100.

In some embodiments, the encapsulation layer 340 exposes (or does not cover) the top surface 330A of the conductive features 330 and the top surface 150A of the protection layer 150. In some embodiments, the conductive features 330 penetrate through the encapsulation layer 340. In some embodiments, the top surface 330A of the conductive features 330, the top surface 150A of the protection layer 150, and the top surface 340A of the encapsulation layer 340 are substantially coplanar with one another. Accordingly, a redistribution structure, which will be described in more detail later, can be formed over a flat and even surface.

In some embodiments, the encapsulation layer 340 includes a polymer material, such as an organic polymer material. In some embodiments, the encapsulation layer 340 includes a molding compound material, ABF, or another suitable encapsulating material. The encapsulation layer 340 may be a molding compound layer, which includes an epoxy-based resin with fillers dispersed therein. The fillers may include insulating fibers, insulating particles, other suitable elements, or a combination thereof. In some embodiments, the encapsulation layer 340 and the protection layer 150 include different materials. However, embodiments of the disclosure are not limited thereto. In some other embodiments, the encapsulation layer 340 and the protection layer 150 include substantially the same material. For example, the encapsulation layer 340 and the protection layer 150 include an organic material.

In some embodiments, the encapsulation layer 340 is deposited using a molding process. In some embodiments, a molding compound material is deposited over the adhesive layer 320. In some embodiments, a thermal process is then performed to cure and harden the molding compound material and to transform it into the encapsulation layer 340. As a result, the conductive features 330 and the semiconductor dies 300 are surrounded and encapsulated by the deposited encapsulation layer 340.

In some embodiments, during or after the deposition of the encapsulation layer 340, the encapsulation layer 340 does not cover the top surface 330A of the conductive features 330 and/or the top surface 150A of the protection layer 150. As a result, it is not necessary for the encapsulation layer 340 to be thinned since the conductive features 330 have been exposed without being covered by the encapsulation layer 340. Accordingly, the fabrication cost and process time are reduced. Damage due to a thinning process may also be prevented.

However, embodiments of the disclosure are not limited thereto. In some other embodiments, the encapsulation layer 340 covers the top surface 330A of the conductive features 330 and/or the top surface 150A of the protection layer 150. In these embodiments, the encapsulation layer 340 will be partially removed in a subsequent process until the conductive features 330 and/or the conductive pads 120 are exposed. This subsequent process may or may not be a thinning process, such as a grinding process, a CMP process, another applicable process, or a combination thereof.

Figure 1G:
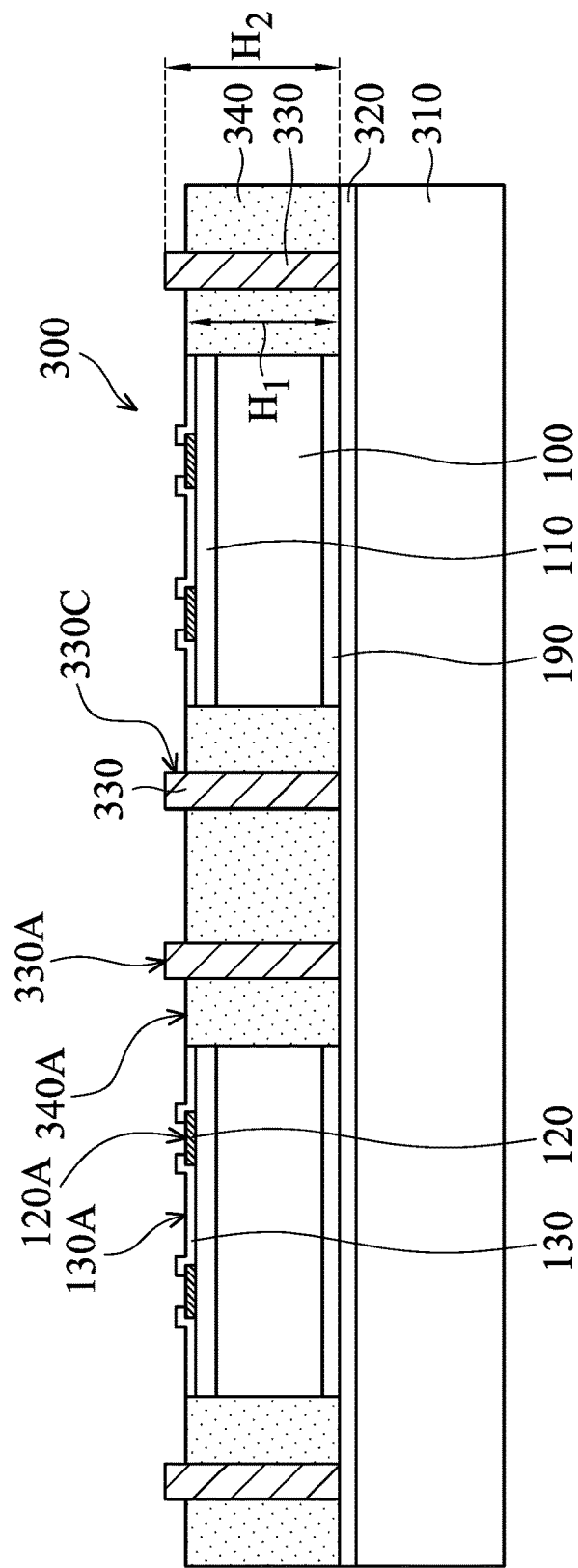

As shown in FIG. 1G, the protection layer 150 is removed, in accordance with some embodiments. As a result, the passivation layer 130 and the conductive pads 120 are exposed. For example, the top surface 120A of the conductive pads 120 is partially exposed. After the removal of the protection layer 150, the semiconductor dies 300 become thinner and have a height $H_1$. The height $H_1$ may be less than the height $H_2$ of the conductive features 330, as shown in FIG. 1G.

As mentioned above, the protection layer 150 is used as a sacrificial layer. The protection layer 150 prevents the conductive pads 120 from being covered by the material of the encapsulation layer 340 during the deposition of the encapsulation layer 340. After the deposition of the encapsulation layer 340, the protection layer 150 is removed. More specifically, if the protection layer 150 is not formed, the encapsulation layer 340 covers the conductive pads 120. As a result, it may be difficult to expose the conductive pads 120 by partially removing the encapsulation layer 340. Alternatively, the conductive pads 120 may be damaged when the encapsulation layer 340 is partially removed to expose the conductive pads 120.

In some embodiments, the encapsulation layer 340 is partially removed during the removal of the protection layer 150. As a result, the encapsulation layer 340 becomes thinner. In some embodiments, an etching process is used to remove the protection layer 150. The etching process may be an anisotropic dry etching process, another applicable process, or a combination thereof. In some embodiments, the encapsulation layer 340 is etched during the etching process for removing the protection layer 150.

As mentioned above, in some other embodiments, the encapsulation layer 340 covers the top surface 330A of the conductive features 330 and/or the top surface 150A of the protection layer 150. In these embodiments, the encapsulation layer 340 is partially removed and the protection layer 150 is completely removed using the same process (such as an etching process) at the same stage until the conductive features 330 and/or the conductive pads 120 are exposed. As a result, no thinning process to the encapsulation layer 340 is required. The fabrication cost and process time are reduced. Damage due to a thinning process may also be prevented.

Many variations and/or modifications can be made to embodiments of the disclosure. For example, the protection layer 150 may not be a sacrificial layer. In some other embodiments, the protection layer 150 is not removed and remains in the package structure. Afterwards, openings (not shown) may be formed in the protection layer 150 to provide the conductive pads 120 with electrical connection paths to a redistribution structure, which will be described in more detail later. For example, a redistribution layer may be formed over the protection layer 150 and fill the openings of the protection layer 150 to be electrically connected to the conductive pads 120.

Figure 1H:
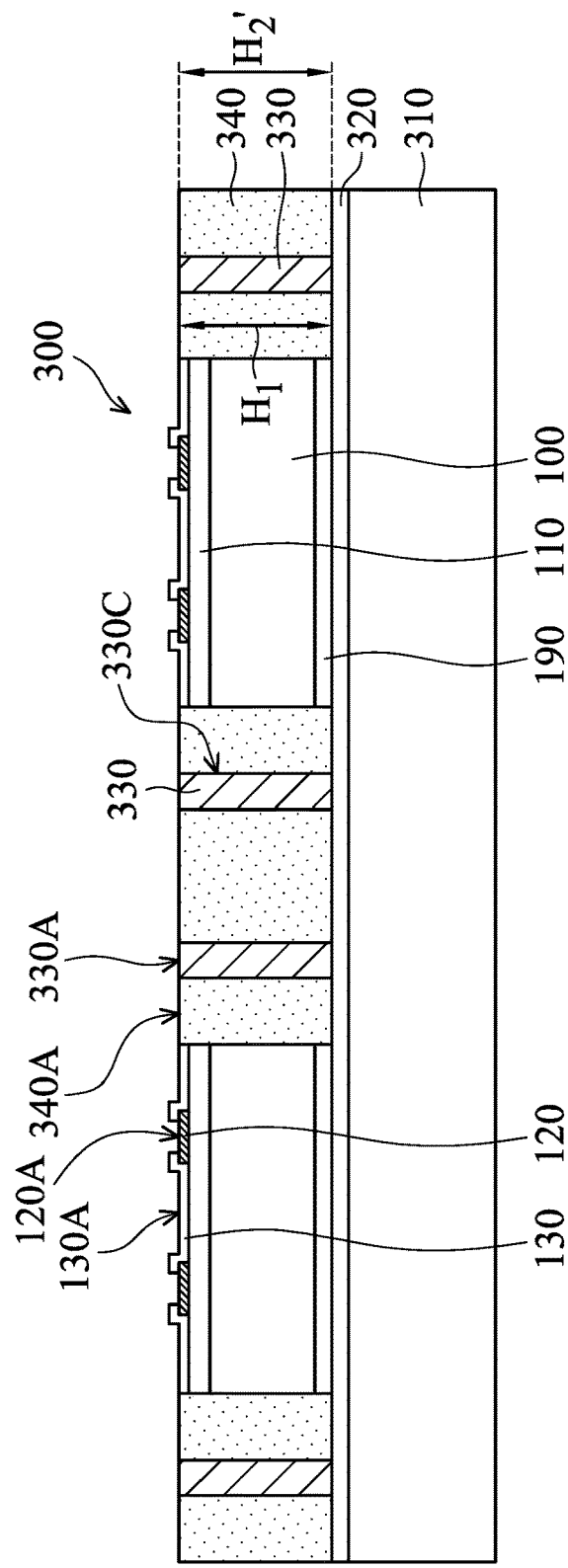

As shown in FIG. 1H, the conductive features 330 are partially removed and become shorter after the removal of the protection layer 150, in accordance with some embodiments. As a result, the conductive features 330 have a reduced height $H_2$' that is substantially equal to the height $H_1$ of the semiconductor dies 300. In some embodiments, the top surface 330A of the conductive features 330 becomes substantially coplanar with the top surface 340A of the encapsulation layer 340 and the top surface 120A of the conductive pads 120. The encapsulation layer 340 covers (or does not expose) the sidewall 300C of the conductive features 330.

Many variations and/or modifications can be made to embodiments of the disclosure. In some other embodiments, the conductive features 330 become shorter but remain higher than the semiconductor dies 300. In some other embodiments, the conductive features 330 are recessed in the encapsulation layer 340. As a result, the conductive features 330 may have a reduced height that is less than the height $H_1$ of the semiconductor dies 300.

In some embodiments, an etching process is used to shorten the conductive features 330. The etching process may be a wet etching process, another applicable process, or a combination thereof.

Figure 1I:
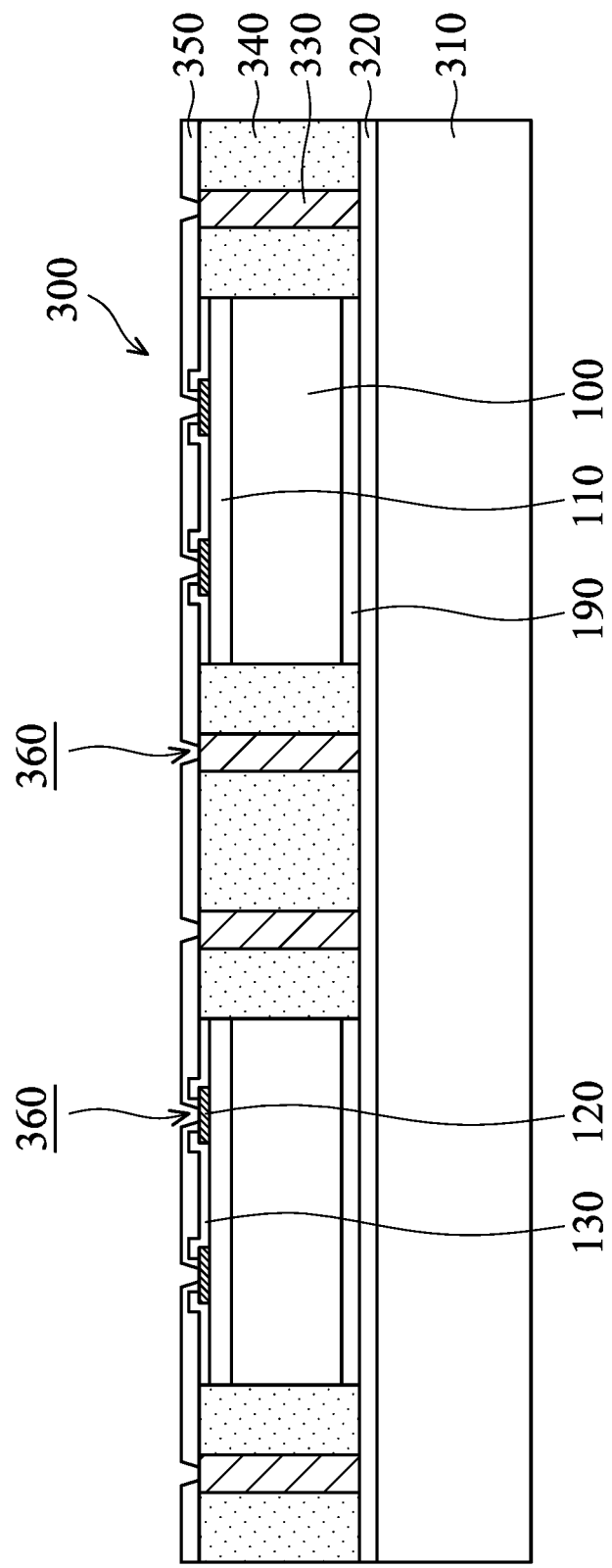
Figure 1J:
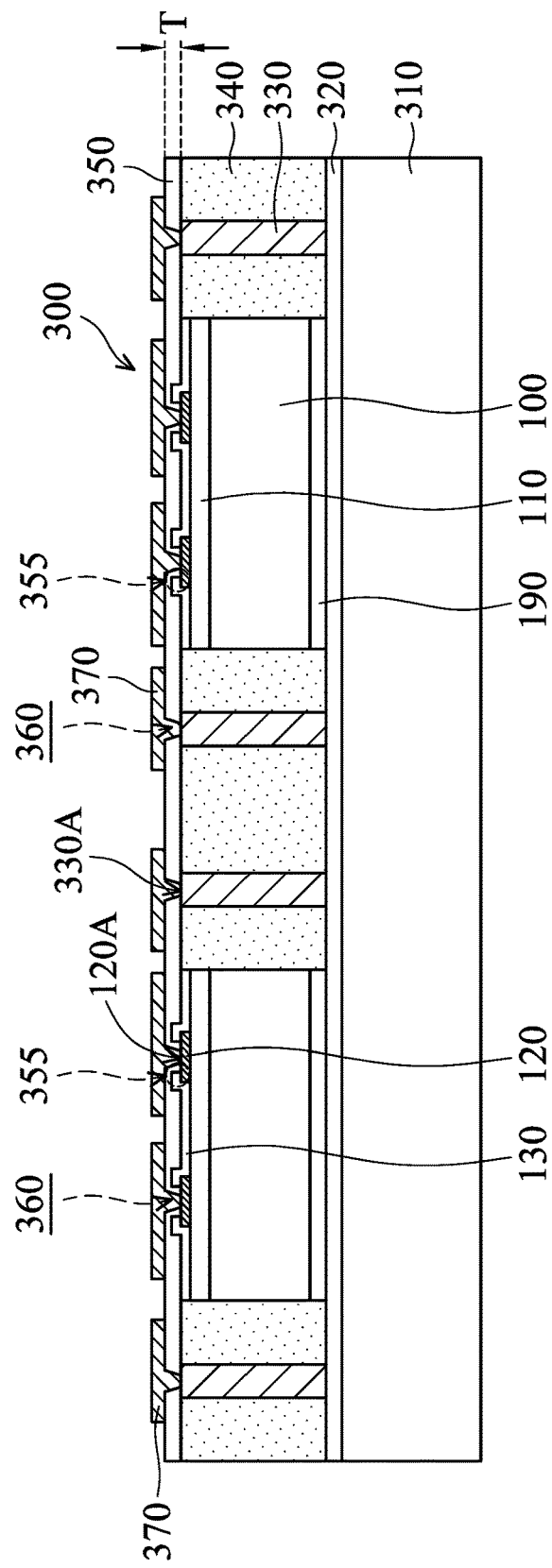
Figure 1K:
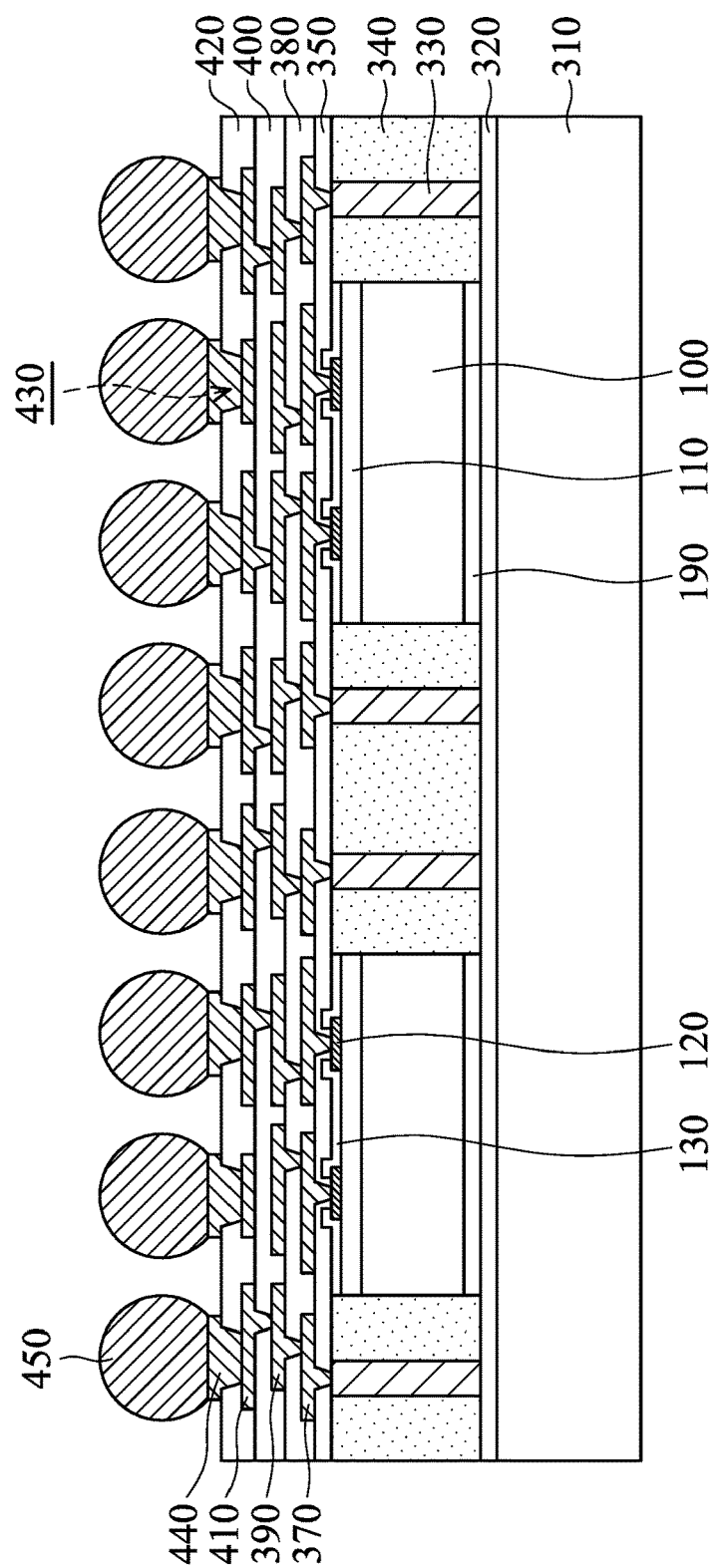

Subsequently, a redistribution structure is formed over the encapsulation layer 340, the conductive features 330 and the semiconductor dies 300, in accordance with some embodiments. The redistribution structure includes one or more dielectric layers and one or more conductive layers. For example, the redistribution structure includes dielectric layers 350, 380, 400 and 420 and conductive layers 370, 390 and 410, as shown in FIGS. 1I-1K in accordance with some embodiments. The conductive layers 370, 390 and 410 may be referred to as redistribution layers (RDLs).

As shown in FIG. 1I, a dielectric layer 350 is deposited over the encapsulation layer 340 and the semiconductor dies 300, in accordance with some embodiments. The dielectric layer 350 covers the conductive features 330 in the encapsulation layer 340. The dielectric layer 350 also covers the passivation layer 130 and the conductive pads 120 of the semiconductor dies 300. In some embodiments, the dielectric layer 350 extends in the passivation layer 130 to adjoin the top surface 120A of the conductive pads 120. In some embodiments, the dielectric layer 350 is in direct contact with the encapsulation layer 340, the conductive features 330, the passivation layer 130 and the conductive pads 120. In some embodiments, a part of the passivation layer 130 is longitudinally sandwiched between the dielectric layer 350 and the dielectric layer 110. In some embodiments, another part of the passivation layer 130 is longitudinally sandwiched between the dielectric layer 350 and the conductive pads 120.

In some embodiments, the dielectric layer 350 is made of a polymer material. The dielectric layer 350 may be made of PBO, PI, BCB, silicone, acrylates, siloxane, another suitable material, or a combination thereof. In some other embodiments, the dielectric layer 350 is made of non-organic materials. The non-organic materials include silicon oxide, un-doped silicate glass, silicon oxynitride, SR, silicon nitride, silicon carbide, hexamethyldisilazane (HMDS), another suitable material, or a combination thereof. In some embodiments, the dielectric layer 350 is deposited using a spin-on process, a spray coating process, a CVD process, an ALD process, a PVD process, another applicable process, or a combination thereof.

As shown in FIG. 1I, multiple openings 360 are formed in the dielectric layer 350, in accordance with some embodiments. Some of the openings 360 partially expose the conductive pads 120 and other openings 360 partially expose the conductive features 330. The openings 360 provide further electrical connection paths, which will be described in more detail later.

In some embodiments, the dielectric layer 350 is patterned to form the openings 360. In some embodiments, the openings 360 are formed using photolithography and etching processes, a laser drilling process, another applicable process, or a combination thereof. However, embodiments of the disclosure are not limited thereto. In some other embodiments, the dielectric layer 350 is photopatternable, and the openings 360 are formed in the dielectric layer 350 using a photolithography process including exposure and developing stages.

As shown in FIG. 1J, a patterned conductive layer 370 is formed over the dielectric layer 350, in accordance with some embodiments. The conductive layer 370 fills the openings 360 of the dielectric layer 350 to be electrically connected to the conductive pads 120 and the conductive features 330. In some embodiments, the conductive layer 370 is in direct contact with (or is physically connected to) the top surface 120A of the conductive pads 120 and the top surface 330A of the conductive features 330. In some embodiments, a part of the dielectric layer 350 is longitudinally sandwiched between the conductive layer 370 and the passivation layer 130. In some embodiments, another part of the dielectric layer 350 is longitudinally sandwiched between the conductive layer 370 and the conductive pads 120.

In some embodiments, the passivation layer 350 has a portion 355 laterally sandwiched between the conductive layer 370 and the passivation layer 130. As shown in FIG. 1J, in some embodiments, the distance between the conductive layer 370 and the passivation layer 130 is substantially equal to the thickness T of the dielectric layer 350.

In some embodiments, the conductive layer 370 is made of a metal material. Examples of the metal material include Cu, Al, W, Ti, Ta, another suitable material, or a combination thereof. In some embodiments, the conductive layer 370 is formed by an electroplating process, an electroless plating process, a sputtering process, a CVD process, or another applicable process.

Afterwards, multiple dielectric layers 380, 400 and 420 and multiple conductive layers 390 and 410 are alternately stacked over the dielectric layer 350 and the conductive layer 370, as shown in FIG. 1K in accordance with some embodiments. In some embodiments, a part of the conductive layer 370 is longitudinally sandwiched between the dielectric layer 380 and the conductive pads 120. The materials and/or formation methods of the dielectric layers 380, 400 and 420 are the same as or similar to those of the dielectric layer 350, and therefore are not repeated. The materials and/or formation methods of the conductive layers 390 and 410 are the same as or similar to those of the conductive layer 370, and therefore are not repeated.

As shown in FIG. 1K, under bump metallization (UBM) layer 440 is formed over the dielectric layer 420, in accordance with some embodiments. The UBM layer 440 fills openings 430 of the dielectric layer 420 to be electrically connected to the conductive layer 410. The UBM layer 440 may have a multi-layer structure including an adhesion layer, a diffusion barrier layer, and/or a wetting layer. In some embodiments, the adhesion layer includes or is made of Cr, TiW, Ti, Al, or a combination thereof. In some embodiments, the diffusion barrier layer includes or is made of Ni, CrCu, TiN, or TiW, or a combination thereof. In some embodiments, the wetting layer includes or is made of Cu, Au, Ag, or a combination thereof.

As shown in FIG. 1K, multiple connectors 450 are formed over the UBM layer 440, in accordance with some embodiments. In some embodiments, the connectors 450 are electrically connected to the conductive layer 410 through the UBM layer 440. The connectors 450 include solder bumps (or solder balls), metal pillars, other suitable connectors, or a combination thereof. In some embodiments, the connectors 450 include Sn, Pb, Ni, Au, Ag, Cu, another suitable conductive material, an alloy thereof, or a combination thereof. In some embodiments, the connectors 450 are formed by evaporation, electrolytic plating, electroless plating, and/or screen printing one or more conductive materials over the UBM layer 440.

Figure 1L:
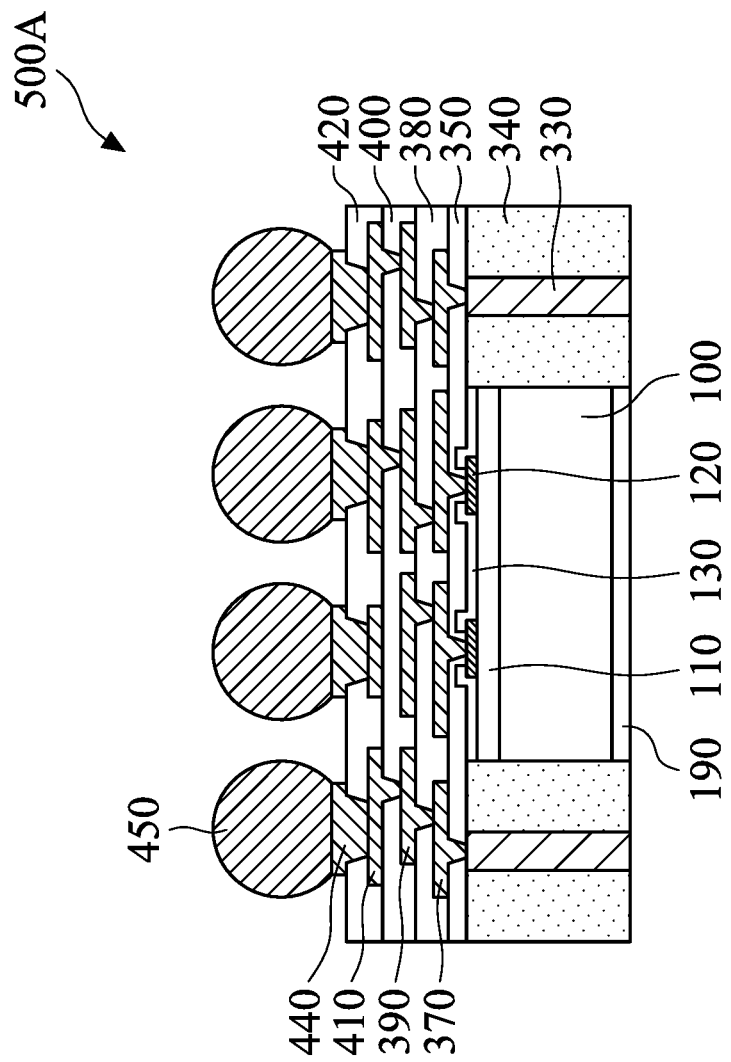

Afterwards, the structure shown in FIG. 1K is placed upside down on a support substrate (not shown), in accordance with some embodiments. Then, the carrier substrate 310 and the adhesive layer 320 are removed. Suitable light may be provided to remove the adhesive layer 320 so as to lift off the carrier substrate 310 as well. Subsequently, a singulation process (or a dicing process) is performed to form multiple package structures including a package structure 500A, as shown in FIG. 1L. Each of the package structures includes one semiconductor die 300 or multiple semiconductor dies 300. FIG. 1L shows that the package structure 500A includes one semiconductor die 300 as an example.

In some embodiments, one or more elements (not shown) are stacked on or bonded to the structure as shown in FIG. 1L. A reflow process may be performed to bond the elements to the structure as shown in FIG. 1L. As a result, multiple package on package (PoP) structures are formed. Each of the PoP structures includes one semiconductor die 300 or multiple semiconductor dies 300. Many variations and/or modifications can be made to embodiments of the disclosure. In some embodiments, the elements are bonded before the singulation process. In some other embodiments, the elements are bonded after the singulation process.

The elements are electrically connected to the conductive features 330. Electrical connections between the elements and the semiconductor dies 300 may therefore be established. In some embodiments, the elements include a chip package, a semiconductor die, one or more passive devices, another suitable structure, or a combination thereof. For example, the elements may include a dynamic random access memory (DRAM) die or other suitable dies.

Many variations and/or modifications can be made to embodiments of the disclosure. Although the embodiments described in FIGS. 1A-1L relate to a fan-out PoP structure, embodiments of the disclosure are not limited thereto. In some other embodiments, no element is bonded to the structure as shown in FIG. 1L and the conductive features 330 are not formed. A singulation process is performed to separate this structure into multiple package structures including one semiconductor die 300 or multiple semiconductor dies 300.

In accordance with some embodiments, no connector is formed over the conductive pads 120 of the semiconductor dies 300, as shown in FIG. 1D. No connector is formed between the conductive pads 120 and the conductive layer 370 of the package structure 500A, as shown in FIG. 1L. The connector may be a conductive bump, a conductive via, a conductive pillar or another suitable connector. The fabrication of the package structure 500A becomes simpler. Therefore, the fabrication cost and process time are reduced. Also, more package structures of good quality and high performance can be fabricated.

More specifically, in some cases, a mask layer (such as a photoresist layer) having multiple openings is used to form connectors, which are physically and electrically coupled to conductive pads. The openings of the mask layer expose conductive pads and define the positions where connectors will be formed. The openings of the mask layer may be formed by a photolithography process including exposure and development operations. However, as the size of a package structure continues to reduce, the openings of the mask layer for forming connectors face manufacturing challenges. There are limitations for a photolithography process to pattern a mask layer and form openings of a small size (width) and a small pitch. Therefore, it may be difficult to further shrink a package structure and electronic products made therefrom.

According to some embodiments of the disclosure, the package structure 500A does not include connectors that are physically and electrically coupled to the conductive pads 120. The package structure 500A becomes thinner. Also, no mask layer for forming connectors and no photolithography process to form openings in a mask layer are required. The pitch between the conductive pads 120 can be reduced according to requirements without being limited by manufacturing challenges of the photolithography process. As a result, the area of the package structure 500A is reduced. The package structure 500A is allowed to shrink even further.

Since the fabrication processes of the package structure 500A have become simpler, the fabrication cost and process time are greatly reduced. Damage to a package structure during the fabrication processes of connectors may also be prevented. Furthermore, there is no need to control the height of connectors and the co-planarity or uniformity of connectors (such as the height difference between connectors). Therefore, the fabrication processes of the package structure 500A can have better control. It becomes easier to form more package structures with enhanced reliability.

Figure 2A:
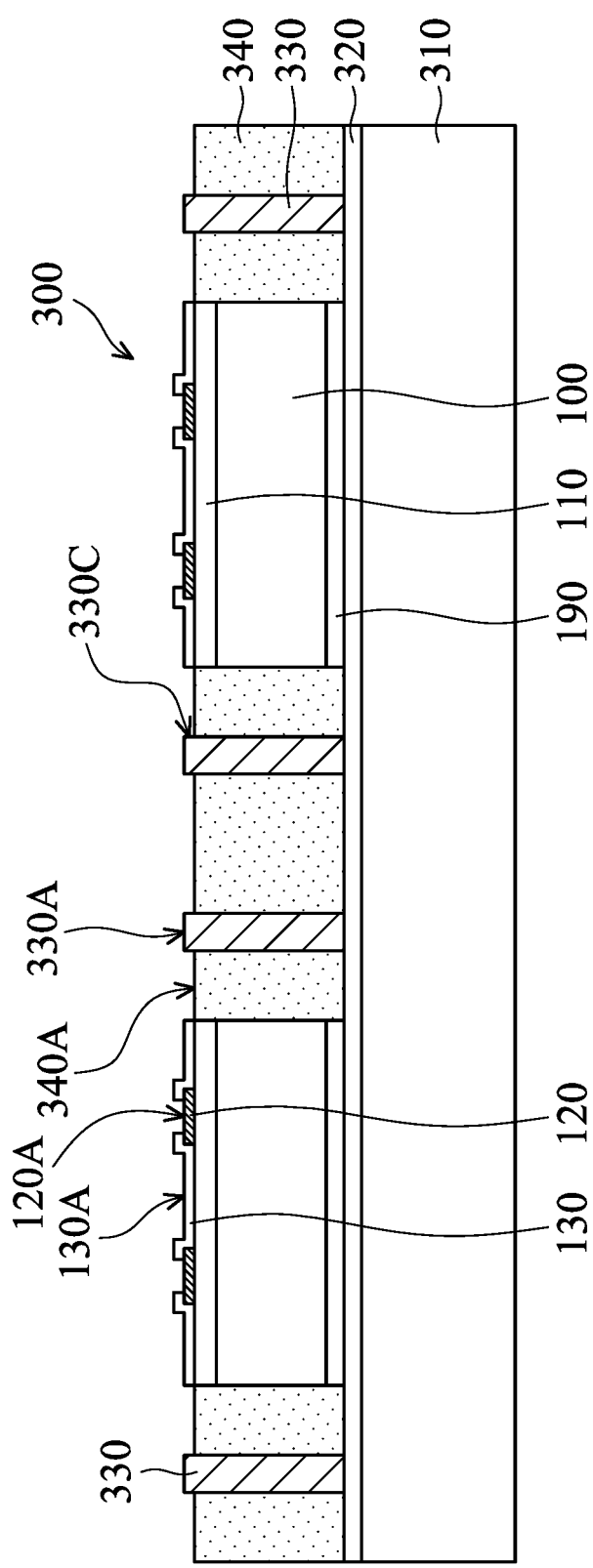
FIGS. 2A-2C are cross-sectional views of various stages of a process for forming a package structure, in accordance with some embodiments.
Figure 2B:
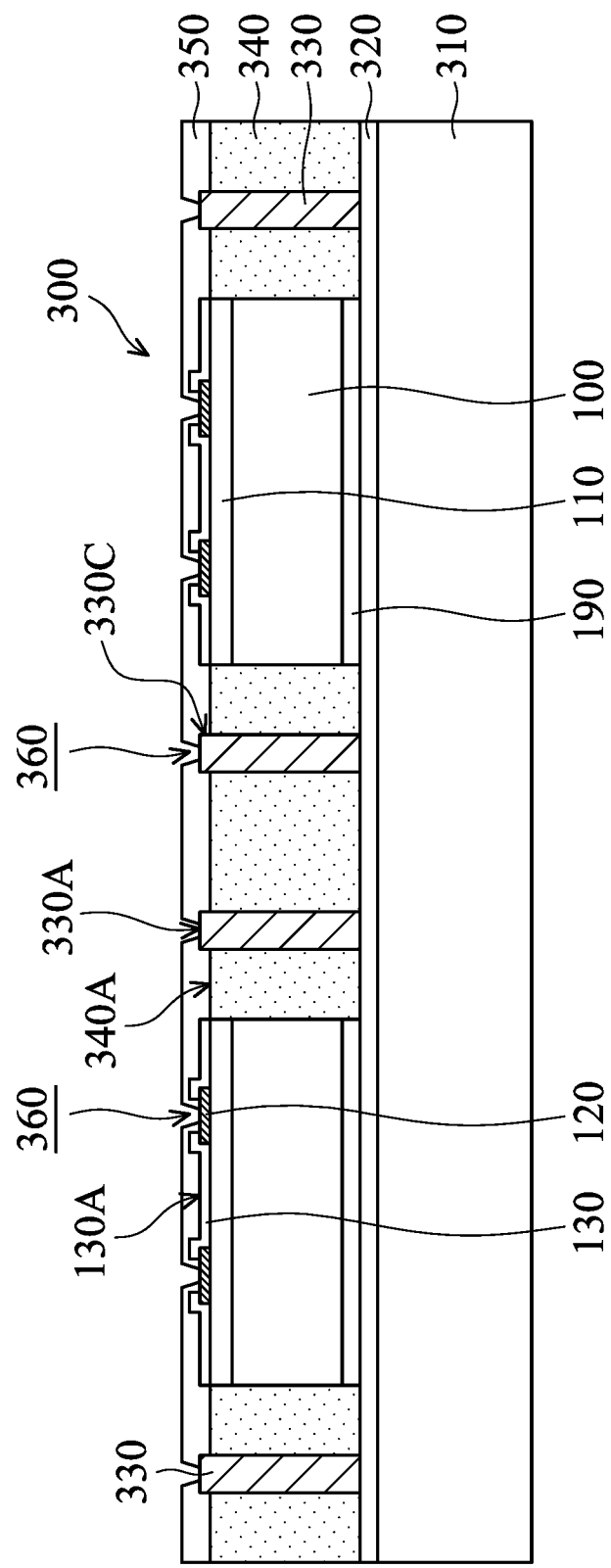
Figure 2C:
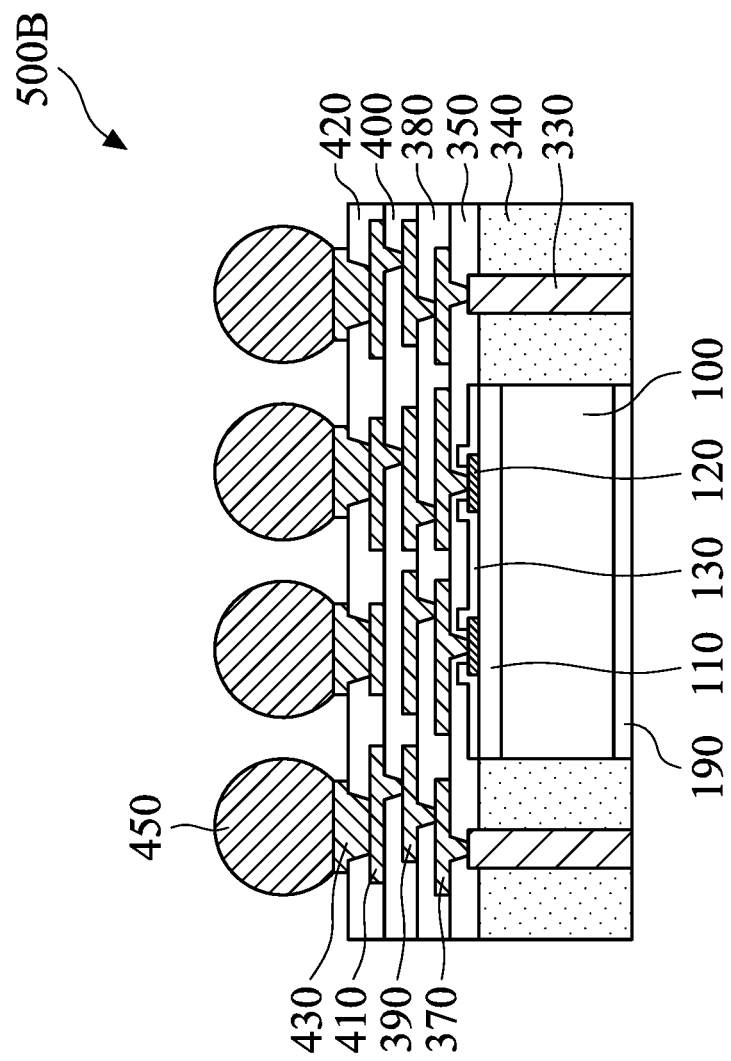

Many variations and/or modifications can be made to embodiments of the disclosure. For example, FIGS. 1G and 1H show that the top surface 340A of the encapsulation layer 340 is substantially coplanar with the top surface 120A of the conductive pads 120 and the top surface 130A of the passivation layer 130. However, embodiments of the disclosure are not limited thereto. FIGS. 2A-2C are cross-sectional views of various stages of a process for forming a package structure, in accordance with some embodiments. The materials and/or formation methods of the structure shown in FIGS. 2A-2C are the same as or similar to those of the structure shown in FIGS. 1A-1L, as illustrated in the aforementioned embodiments, and therefore are not repeated.

As shown in FIG. 2A, the protection layer 150 is removed after the deposition of the encapsulation layer 340. In some embodiments, the top surface 340A of the encapsulation layer 340 becomes lower during and after the removal of the protection layer 150. In some embodiments, the top surface 340A of the encapsulation layer 340 is lower than the top surface 120A of the conductive pads 120, the top surface 130A of the passivation layer 130, and/or the top surface 330A of the conductive features 330.

In some embodiments, the top surface 340A of the encapsulation layer 340 is non-coplanar with the top surface 120A of the conductive pads 120 and the top surface 130A of the passivation layer 130. The top surface 330A of the conductive features 330 may be substantially coplanar with the top surface 120A of the conductive pads 120 and the top surface 130A of the passivation layer 130. As a result, the top surface 340A of the encapsulation layer 340 may be non-coplanar with the top surface 330A of the conductive features 330. For example, the conductive features 330 protrude from the top surface 340A of the encapsulation layer 340. The conductive features 330 may be higher than the semiconductor dies 300.

Afterwards, the steps described in FIG. 1I are performed over the structure shown in FIG. 2A. As a result, the dielectric layer 350 including the openings 360 is formed over the encapsulation layer 340 and the semiconductor dies 300, as shown in FIG. 2B in accordance with some embodiments. Since the top surface 340A of the encapsulation layer 340 is lower than the top surface 130A of the passivation layer 130, the passivation layer 130 is surrounded by the dielectric layer 350 covering the encapsulation layer 340. Since the top surface 340A of the encapsulation layer 340 is lower than the top surface 330A of the conductive features 330, an upper part of the conductive features 330 is surrounded by the dielectric layer 350 covering the encapsulation layer 340. In some embodiments, the dielectric layer 350 is in direct contact with the sidewall 330C of the conductive features 330. In some embodiments, a part of the dielectric layer 350 is laterally sandwiched between the passivation layer 130 and the conductive features 330.

The steps described in FIGS. 1J-1L are performed sequentially over the structure shown in FIG. 2B to continue the fabrication of a package structure 500B, as shown in FIG. 2C.

Many variations and/or modifications can be made to embodiments of the disclosure. For example, FIG. 1H shows that the encapsulation layer 340 exposes the top surface 330A of the conductive features 330 after the removal of the protection layer 150. However, embodiments of the disclosure are not limited thereto. FIGS. 3A-3D are cross-sectional views of various stages of a process for forming a package structure, in accordance with some embodiments. The materials and/or formation methods of the structure shown in FIGS. 3A-3D are the same as or similar to those of the structure shown in FIGS. 1A-1L, as illustrated in the aforementioned embodiments, and therefore are not repeated.

Figure 3A:
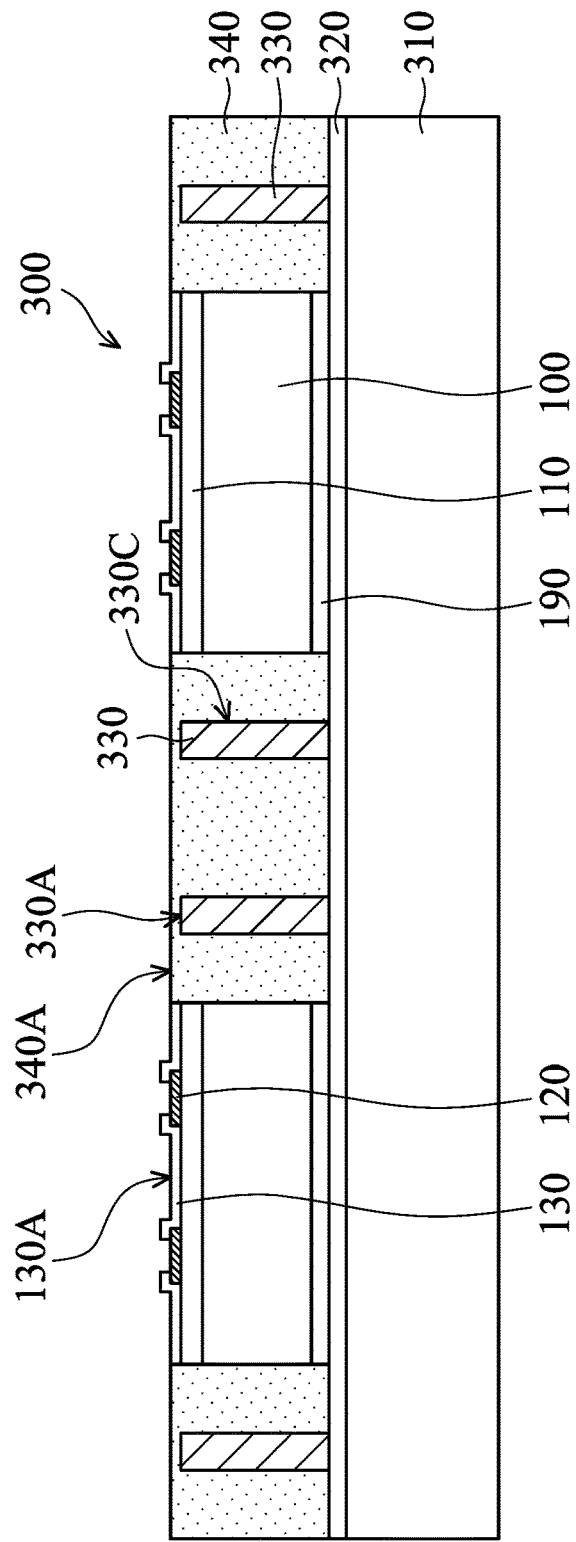
FIGS. 3A-3D are cross-sectional views of various stages of a process for forming a package structure, in accordance with some embodiments.

In accordance with some embodiments, the top surface 330A of the conductive features 330 is covered by the encapsulation layer 340. As shown in FIG. 3A, in some embodiments, the top surface 330A of the conductive features 330 remain covered by the encapsulation layer 340 after the removal of the protection layer 150. In these embodiments, the top surface 340A of the encapsulation layer 340 is non-coplanar with the top surface 130A of the passivation layer 130.

Figure 3B:
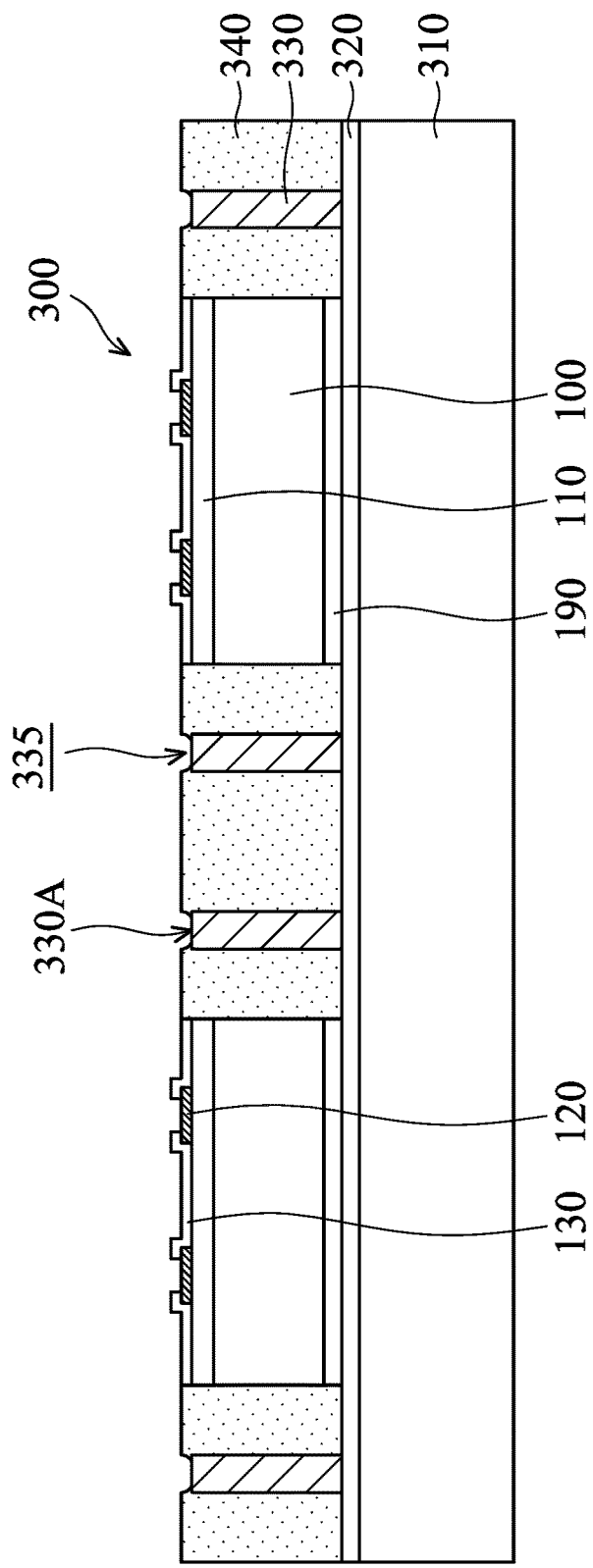

As shown in FIG. 3B, multiple openings 335 are formed in the encapsulation layer 340 to partially expose the top surface 330A of the conductive features 330, in accordance with some embodiments. In some embodiments, the encapsulation layer 340 is partially removed to form the openings 335 using a laser drilling process, another applicable process, or a combination thereof.

Figure 3C:
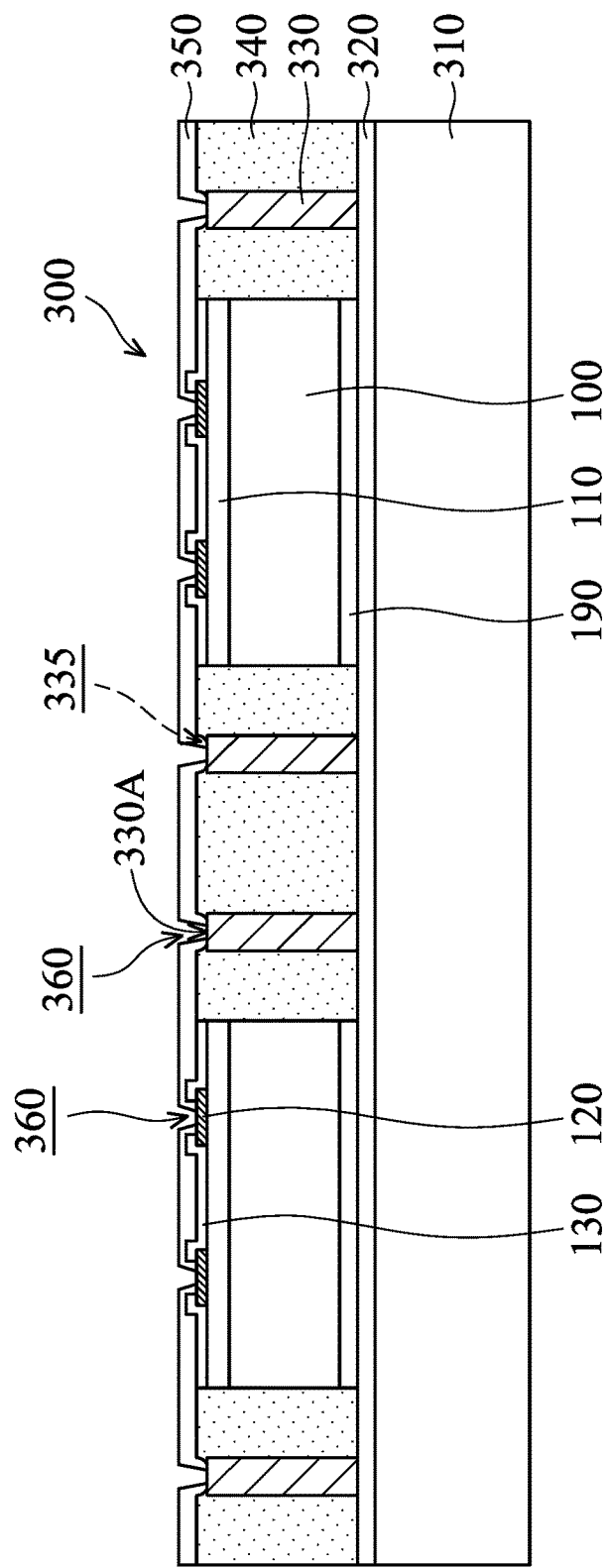

Afterwards, the steps described in FIG. 1I are performed over the structure shown in FIG. 3B. As a result, the dielectric layer 350 including the openings 360 is formed over the encapsulation layer 340 and the semiconductor dies 300, as shown in FIG. 3C in accordance with some embodiments. In some embodiments, the dielectric layer 350 extends in the encapsulation layer 340 to fill up the openings 335 of the encapsulation layer 340. Subsequently, the dielectric layer 350 in the openings 335 is partially removed to form some of the openings 360 exposing the top surface 330A of the conductive features 330. In some embodiments, a part of the encapsulation layer 340 is laterally sandwiched between the dielectric layer 350 in the openings 335 and the passivation layer 130.

Figure 3D:
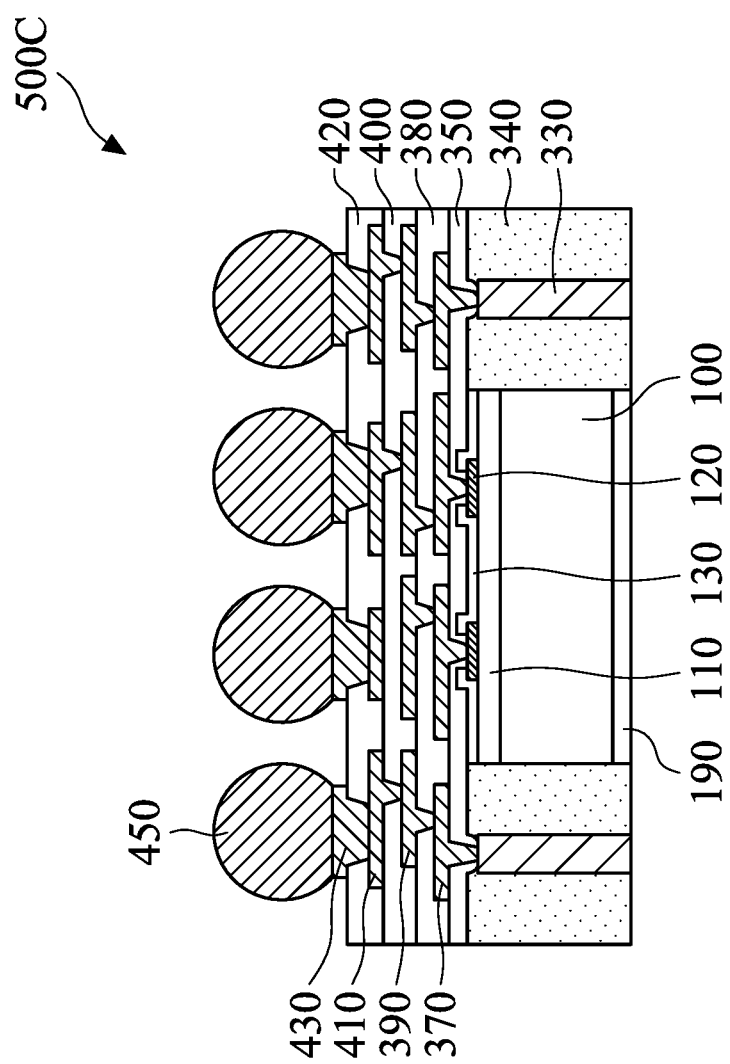

The steps described in FIGS. 1J-1L are performed sequentially over the structure shown in FIG. 3C to continue the fabrication of a package structure 500C, as shown in FIG. 3D.

Embodiments of the disclosure provide package structures and methods for forming the same. A package structure includes a semiconductor die surrounded by an encapsulation layer, and a redistribution structure over the semiconductor die and the encapsulation layer. The semiconductor die include conductive pads but does not include connectors (such as bumps, vias, or pillars) that are physically coupled to the conductive pads. No connector is formed between the conductive pads and the redistribution structure. As a result, the package structure becomes thinner. Also, the pitch between the conductive pads is allowed to be reduced without being limited by manufacturing challenges of connectors. The size of the package structure is reduced even further. Furthermore, since the fabrication processes of the package structure have become simpler, the fabrication cost and process time are greatly reduced. More package structures of improved reliability can be fabricated.

In accordance with some embodiments, a package structure is provided. The package structure includes a semiconductor die. The semiconductor die includes a passivation layer over a semiconductor substrate. The semiconductor die also includes a conductive pad in the passivation layer. The passivation layer partially exposes a top surface of the conductive pad. The package structure also includes an encapsulation layer surrounding the semiconductor die. The package structure further includes a dielectric layer covering the semiconductor die and the encapsulation layer. In addition, the package structure includes a redistribution layer covering the dielectric layer. The redistribution layer extends in the dielectric layer to be physically connected to the top surface of the conductive pad.

In accordance with some embodiments, a package structure is provided. The package structure includes a semiconductor substrate in an encapsulation layer. The package structure also includes a passivation layer over the semiconductor substrate. The package structure further includes a conductive pad in the passivation layer. In addition, the package structure includes a conductive pillar in the encapsulation layer. The package structure also includes a first dielectric layer covering the passivation layer and the encapsulation layer. The first dielectric layer adjoins the conductive pad and the conductive pillar. The package structure further includes a redistribution layer covering the first dielectric layer. The redistribution layer extends in the first dielectric layer to be physically connected to the conductive pad and the conductive pillar.

In accordance with some embodiments, a method for forming a package structure is provided. The method includes forming a semiconductor die. The semiconductor die includes a passivation layer over a semiconductor substrate. The semiconductor die also includes a conductive pad in the passivation layer. The semiconductor die further includes a protection layer covering the conductive pad. The method also includes forming an encapsulation layer surrounding the semiconductor die. The method further includes removing the protection layer to expose the conductive pad after the formation of the encapsulation layer. In addition, the method includes forming a dielectric layer covering the conductive pad, the passivation layer and the encapsulation layer. The method also includes partially removing the dielectric layer to form a first opening exposing the conductive pad. The method further includes forming a redistribution layer over the dielectric layer. The redistribution layer fills the first opening to be electrically connected to the conductive pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a semiconductor die, comprising:
   a passivation layer over a semiconductor substrate; and
   a conductive pad in the passivation layer, wherein the passivation layer partially exposes a top surface of the conductive pad;
   an encapsulation layer surrounding the semiconductor die;
   a conductive pillar surrounded by the encapsulation layer and protruding from the encapsulation layer;
   a dielectric layer covering the semiconductor die and the encapsulation layer, wherein the dielectric layer is in direct contact with a top surface and a sidewall of the conductive pillar; and a redistribution layer covering the dielectric layer, wherein the redistribution layer extends in the dielectric layer to be physically connected to the top surface of the conductive pad.

2. The package structure as claimed in claim 1, wherein the dielectric layer adjoins the conductive pad, the passivation layer and the encapsulation layer.

3. The package structure as claimed in claim 1, wherein the dielectric layer extends in the passivation layer, and the top surface of the conductive pad is partially exposed by the dielectric layer.

4. The package structure as claimed in claim 1, wherein the redistribution layer is in contact with the conductive pillar and the conductive pad.

5. The package structure as claimed in claim 1, wherein the top surface of the conductive pillar is substantially coplanar with the top surface of the conductive pad.

6. A package structure, comprising:
   a semiconductor substrate in an encapsulation layer;
   a passivation layer over the semiconductor substrate;
   a conductive pad in the passivation layer;
   a conductive pillar in the encapsulation layer, wherein a top surface of the conductive pillar is lower than a top surface of the encapsulation layer;
   a first dielectric layer covering the passivation layer and the encapsulation layer, wherein the first dielectric layer is in direct contact with the conductive pad and the conductive pillar; and
   a redistribution layer covering the first dielectric layer, wherein the redistribution layer extends in the first dielectric layer to be physically connected to the conductive pad and the conductive pillar.

7. The package structure as claimed in claim 6, further comprising a second dielectric layer covering the first dielectric layer and the redistribution layer, wherein the redistribution layer is sandwiched between the second dielectric layer and the conductive pad.

8. The package structure as claimed in claim 6, wherein a distance between the passivation layer and the redistribution layer is substantially equal to a thickness of the first dielectric layer.

9. The package structure as claimed in claim 6, wherein a top surface of the conductive pillar is in contact with the first dielectric layer.

10. A method for forming a package structure, comprising:
    forming a semiconductor die, comprising:
    a passivation layer over a semiconductor substrate;
    a conductive pad in the passivation layer; and
    a protection layer in contact with the conductive pad;
    forming an encapsulation layer surrounding the semiconductor die;
    removing the protection layer to expose the conductive pad and the passivation layer after the formation of the encapsulation layer;
    forming a dielectric layer covering the conductive pad, the passivation layer and the encapsulation layer;
    partially removing the dielectric layer to form a first opening exposing the conductive pad; forming a conductive pillar surrounded by the encapsulation layer, wherein the conductive pillar protrudes from the encapsulation layer after the removal of the protection layer; wherein the dielectric layer is in direct contact with a top surface and a sidewall of the conductive pillar; and
    forming a redistribution layer over the dielectric layer, wherein the redistribution layer fills the first opening to be electrically connected to the conductive pad.

11. The method for forming a package structure as claimed in claim 10, wherein a top surface of the protection layer is exposed after the formation of the encapsulation layer.

12. The method for forming a package structure as claimed in claim 10, wherein the protection layer covers the conductive pad and the passivation layer, and wherein the passivation layer becomes exposed during the removal of the protection layer.

13. The method for forming a package structure as claimed in claim 10, wherein the protection layer and the encapsulation layer are etched during the removal of the protection layer.

14. The method for forming a package structure as claimed in claim 10, wherein the dielectric layer comprising the first opening is in contact with the conductive pad.

15. The method for forming a package structure as claimed in claim 10, wherein the formation of the semiconductor die comprises:
    forming the conductive pad and the passivation layer over the semiconductor substrate;
    forming the protection layer over the semiconductor substrate to cover the conductive pad and the passivation layer, wherein the protection layer adjoins the conductive pad; and
    dicing the protection layer, the passivation layer and the semiconductor substrate to form the semiconductor die.

16. The method for forming a package structure as claimed in claim 10, wherein removing the protection layer comprises:
    etching the protection layer and a top portion of the encapsulation layer to expose a portion of a sidewall of the conductive pillar.

* * * * *